United States Patent [19]

Rohulich et al.

[11] Patent Number: 5,115,143
[45] Date of Patent: May 19, 1992

[54] EFFICIENT P-CHANNEL FET DRIVE CIRCUIT

[75] Inventors: Alan S. Rohulich, Endwell; Ronnie A. Wunderlich, Endicott, both of N.Y.

[73] Assignee: International Business Machines, Armonk, N.Y.

[21] Appl. No.: 741,922

[22] Filed: Aug. 8, 1991

[51] Int. Cl.⁵ .................... H03K 17/687; H03K 3/01; H03K 17/16; H01J 19/82
[52] U.S. Cl. .................................. 307/571; 307/573; 307/574; 307/270; 307/443; 328/223
[58] Field of Search ............... 307/570, 571, 572, 573, 307/574, 443, 577, 270; 328/113, 223, 65

[56] References Cited

U.S. PATENT DOCUMENTS 4,890,021  12/1989  Walker ................................ 307/570
4,894,568  1/1990  Pavlin .................................. 307/570

Primary Examiner—John S. Heyman
Assistant Examiner—Trong Q. Phan
Attorney, Agent, or Firm—William H. Steinberg

[57] ABSTRACT

A drive circuit for a P-channel FET is provided which uses a switch means to bias the P-channel FET into conduction and passive components to bias the P-channel FET out of conduction, reducing the components required in the drive circuit and the power dissipated. Energy stored in an inductor while the P-channel FET is conducting is used to provide current through a capacitor in series with the gate to source capacitance of the P-channel FET reducing the stored charge and turning off the P-channel FET.

7 Claims, 2 Drawing Sheets

EFFICIENT P-CHANNEL FET DRIVE CIRCUIT

BACKGROUND OF THE INVENTION

The present invention is related to a drive circuit for controlling the conductive and nonconductive states of a P-channel FET transistor.

The use of P-channel MOSFETS in power conversion circuits requires a fairly complex drive scheme in order to achieve efficient utilization of the device. The traditional methods for realizing this function require the use of high wattage resistors for controlling the switching of the P-channel MOSFET. One application of the P-channel MOSFET is in switched mode power converter circuits such as buck or step down converters. Using previous or traditional drive schemes, power losses incurred could exceed the total output power delivered by the buck power converter. Previous schemes used two active devices to control the P-channel MOSFET, one to turn the FET on and one to the turn the FET off. Two active devices in the control requires the need for additional support components for circuit operability. The total component count affects circuit reliability as well as cost and card space required.

It is an object of the present invention to provide a drive circuit for a P-channel MOSFET that has lower power losses.

It is a further object of the present invention to provide a drive circuit for P-channel FET with higher reliability, lower cost and which requires less card space to implement.

SUMMARY OF THE INVENTION

In one aspect of the present invention, a drive circuit for a P-channel field effect transistor is provided having a first and second input terminal and a first and second output terminal. The first and second input terminal is couplable to a dc voltage source and a first and second output terminal. The second input and second output terminal are coupled to one another. The P-channel field effect transistor has its source and drain terminals coupling the first input terminal to the first output terminal. A capacitor has one side coupled to the gate of the P-channel field effect transistor. Switch means is coupled between the other side of the capacitor and the second input terminal. An inductor couples the first input terminal and the junction of the switch means and the capacitor to one another. When the switch means is conductive and nonconductive the P-channel field effect transistor is biased into and out of conduction, respectively. When the switch means is conductive, the capacitor and the gate to source capacitance of the P-channel field effect transistor are charged. When the voltage from the source to gate gets to a threshold value, the P-channel transistor is biased into conduction. While the capacitor and the gate to source voltage are charging, energy is being stored in the inductor to turn off the P-channel transistor. When the switch means becomes nonconductive, current from the inductor flows through the capacitor and gate source capacitance of the P-channel, reducing the stored charge and reducing the gate to source voltage sufficiently to cause the P-channel field effect transistor to become nonconductive.

DETAILED DESCRIPTION

Figure 1:
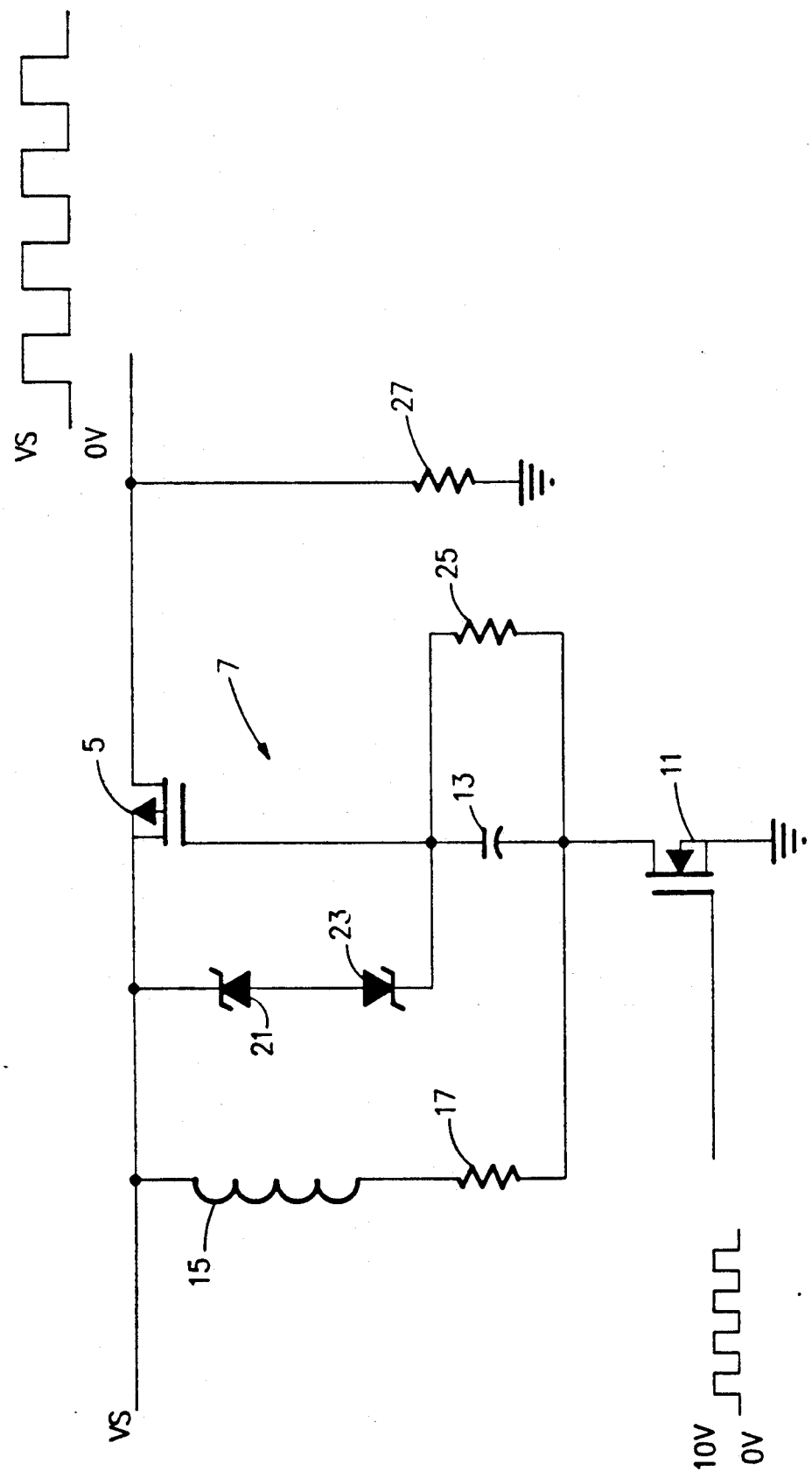
FIG. 1 is a schematic diagram of drive circuit connected to a P-channel MOSFET in accordance with the present invention.

Referring now to the drawing and particularly FIG. 1 thereof a P-channel field effect transistor, shown as a P-channel MOSFET 5, is connected to a drive circuit 7. An input voltage VS to be switched by the P-channel FET 5 is connected between the source of the P-channel FET 5 and ground. The drive circuit 7 comprises a switch means shown as N-channel FET 11 which receives control signals at its gate. While a field effect transistor is shown, a bipolar transistor or relay could alternatively be used as the switch means. The source of the FET 11 is connected to ground and the drain of the FET 11 is connected through a capacitor 13 to the gate of the P-channel FET 5. An inductor 15 connected in series with a current limiting resistor 17 are connected between the source of the P-channel FET 5 and the drain of FET 11. Voltage limiting means are connected across the gate to source terminals of the P-channel FET 5. In the present embodiment back to back zener diodes 21 and 23 are used. A bleed resistor 25 is connected across capacitor 13. The drain of the P-channel FET 5 is connected to a load shown as a resistor 27 connected to ground.

Figure 2A:
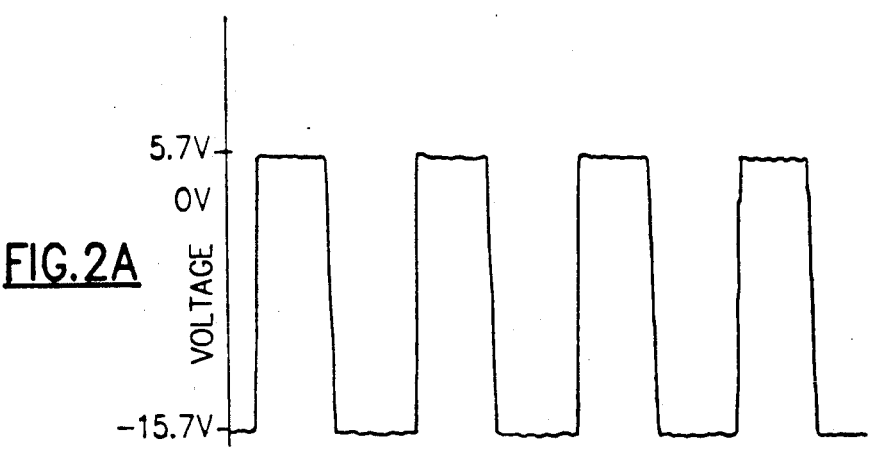
FIGS. 2A, 2B, 2C, and 2C show waveforms on a common time scale of the voltage across the gate to source terminals of the P-channel MOSFET, the voltage across the inductor, the voltage across the capacitor, and the voltage at the gate of the transistor receiving the control signals, respectively.

The operation of the circuit will be explained in connection with the waveforms of FIGS. 2A, 2B, 2C, and 2D, which are the voltage across the source to gate of P-channel FET 5, the voltage across the inductor 15, the voltage across the capacitor 13, and the voltage at the gate of FET 11, all shown on a common time scale. The pulses are shown during operation after any initial transients that might occur when operation is begun and the capacitor 13 is initially discharged. The zener diodes 21 and 23 used had values of 5 and 15 volts, respectively. In operation, FET 11 performs the switching function for turning on and turning off the P-channel FET 5. The gate of the switch can be driven by a signal derived from a pulse width modulator, for example, not shown. Assuming FET 11 is initially off, a voltage signal applied to the gate of FET 11 biases it into conduction. The source to gate capacitance of P-channel FET 5 and the capacitor 13, charge up as shown in FIGS. 2A and 2C. When the source to gate capacitance of the P-channel FET 5 is four volts or greater the P-channel FET is biased into conduction. Back to back zener diodes 21 and 23 limit the maximum voltage across the gate to source terminals of the P-channel FET and limit the voltage on capacitor 13. While capacitor 13 is charging, the inductor is storing energy to be used for turning P-channel FET 5 off. In order to turn off the P-channel FET off the source to gate voltage must be less than three volts.

Figure 2B:
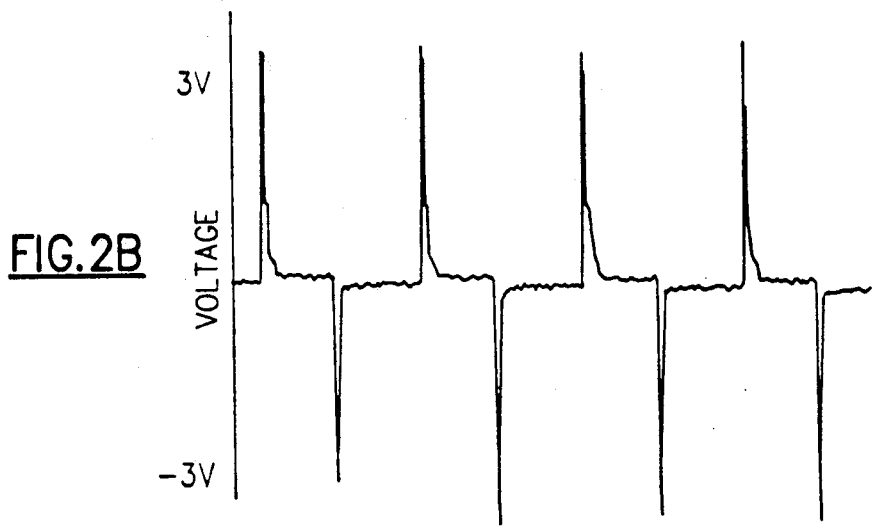
Figure 2C:
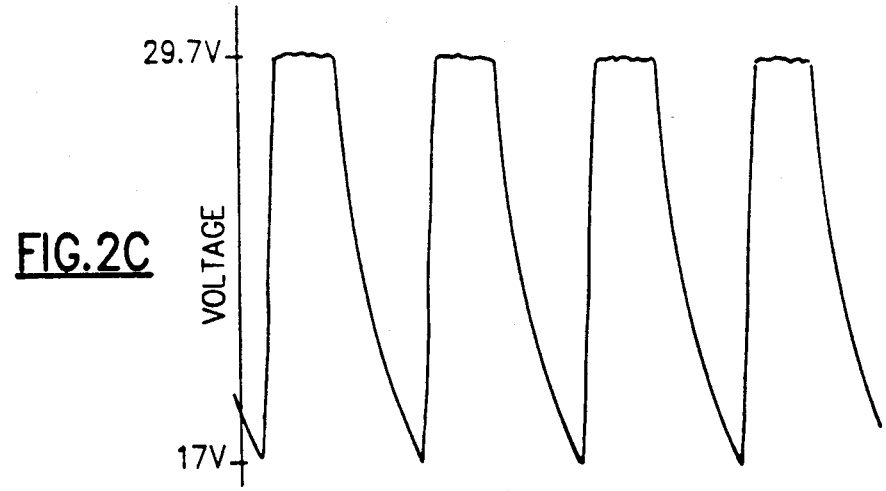
Figure 2D:
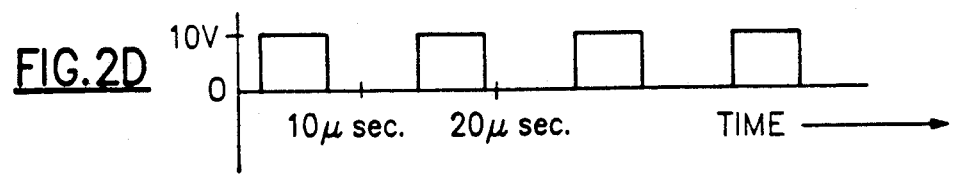

When FET 11 is turned off by a decrease in signal voltage at its gate, the voltage across inductor 15 reverses as shown in FIG. 2B and current from the inductor continues to flow. The current from inductor 15 charges capacitor 13 and the source to gate capacitance of the P-channel FET 5 in a direction opposite from the direction they were charged when FET 11 was conducting. The reverse current flow reduces the source to gate voltage of P-channel FET 5 to less than three volts, turning the P-channel FET off. The source to gate voltage is clamped by zener diode 23.

The value of capacitor 13 is chosen to be approximately ten times greater than the source to gate capacitance of the P-channel FET 5. This effectively sets up a voltage divider between the two capacitances which guarantees that the P-channel FET 5 will turn on under the worst circuit conditions. Inductor 15 is chosen to store enough energy to reverse the polarity of the charge stored by the source to gate capacitance of P-channel FET 5 and capacitor 13. Resistor 17 is selected to limit the current through the inductor and still have enough energy in inductor 15 to turn off the P-channel FET.

The drive circuit can be used in buck or boost configuration switchmode power converter circuits and horizontal and vertical deflection circuits for cathode ray tubes. When used in a buck converter, for example, the drain of the P-channel FET connects to a free wheeling diode and an inductor and capacitor network which form a buck converter (not shown). Controlling the switching duty cycle of P-channel FET by means of the FET, a regulated output can be obtained at the output of a filter capacitor (not shown).

The foregoing has described an efficient, low cost, high reliability circuit for driving P-channel FET transistors.

While the invention has been particularly shown and described with reference to a preferred embodiment thereof, it will be understood by those skilled in the art that various changes in form and detail may be made without departing from the spirit and scope of the invention.

What is claimed is:

1. A drive circuit for a P-channel field effect transistor comprising:
   a first and second input terminal couplable to a dc voltage source and a first and second output terminal, said second input and second output terminal coupled to one another, said P-channel field effect transistor having its source and drain terminals coupling the first input terminal to the first output terminal;
   a capacitor having one side coupled to the gate of the P-channel field effect transistor;
   switch means coupled between the other side of the capacitor and the second input terminal; and
   an inductor coupling said first input terminal and the junction of said switch means and said capacitor, said switch means when conductive and nonconductive causing said P-channel transistor to be biased into and out of conduction, respectively.

2. The drive circuit of claim 1 wherein said switch means comprises a transistor.

3. The drive circuit of claim 1 further comprising voltage limiting means connected across the gate and source terminals of the P-channel transistor.

4. The drive circuit of claim 1 further comprising a resistor in series with said inductor.

5. The drive circuit of claim 1 further comprising a resistor in parallel with said capacitor.

6. The drive circuit of claim 3 wherein said voltage limiting means comprises back to back zener diodes.

7. The drive circuit of claim 2 wherein said switch comprises an N-channel field effect transistor.

* * * * *